(12) United States Patent
Hsin et al.

(10) Patent No.: US 7,268,346 B2
(45) Date of Patent: Sep. 11, 2007

(54) METHOD OF DISASSEMBLING AN IMAGE SENSOR PACKAGE

(75) Inventors: Chung Hsien Hsin, Hsinchu Hsien (TW); Sing Lon Wu, Hsinchu Hsien (TW)

(73) Assignee: Kingpak Technology Inc., Hsien Chu Hsien (TW)

( * ) Notice: Subject to any disclaimer, the term of this patent is extended or adjusted under 35 U.S.C. 154(b) by 0 days.

(21) Appl. No.: 11/213,256

(22) Filed: Aug. 26, 2005

(65) Prior Publication Data

US 2007/0045512 A1    Mar. 1, 2007

(51) Int. Cl.
*H01J 5/02* (2006.01)
*H01J 40/14* (2006.01)

(52) U.S. Cl. .................................................. 250/239

(58) Field of Classification Search ............. 250/208.1, 250/239, 216; 438/464, 107, 108, 68, 73; 257/431–434, 678, 704
See application file for complete search history.

(56) References Cited

U.S. PATENT DOCUMENTS

| 5,270,491 | A | * | 12/1993 | Carnall et al. ............ 174/50.54 |
| 5,402,885 | A | * | 4/1995 | Cook et al. .................. 206/723 |
| 6,054,008 | A | * | 4/2000 | Chan et al. ................... 156/247 |
| 6,184,514 | B1 | * | 2/2001 | Rezende et al. .......... 250/208.1 |
| 6,579,399 | B1 | * | 6/2003 | Hamren ...................... 156/232 |
| 6,661,080 | B1 | * | 12/2003 | Glenn et al. ................. 257/620 |

* cited by examiner

*Primary Examiner*—Thanh X. Luu
*Assistant Examiner*—Suezu Ellis
(74) *Attorney, Agent, or Firm*—Pro-Techtor Int'l Services

(57) ABSTRACT

A method of disassembling an image sensor package, which includes a substrate and a glass layer at opposite sides. The method includes the steps of: providing a film tape adhered to the glass layer; providing a vacuuming means to suck the substrate of the image sensor package; and moving the vacuuming means away from the film tape to peel the glass layer off the image sensor package.

2 Claims, 2 Drawing Sheets

METHOD OF DISASSEMBLING AN IMAGE SENSOR PACKAGE

BACKGROUND OF THE INVENTION

1. Field of the Invention

The invention relates to a method of disassembling an image sensor package, and more particularly to a method of disassembling an image sensor package to increase the product reliability and to simplify the disassembling processes.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, an image sensor structure includes a substrate 10, a frame layer 18, a photosensitive chip 26, a plurality of wires 28, and a transparent layer 34.

The substrate 10 has a first surface 12 on which a plurality of first electrodes 15 are formed, and a second surface 14 on which a plurality of second electrodes 16 are formed. The first electrodes 15 are respectively electrically connected to the second electrodes 16 by the conductive wires 17, which are located at the side of the substrate. The frame layer 18 has an upper surface 20 and a lower surface 22 adhered to the first surface 12 of the substrate 10 to form a chamber 24 together with the substrate 10. The photosensitive chip 26 is arranged within the chamber 24, and is mounted to the first surface 12 of the substrate 10. Each wire 28 has a first terminal 30 and a second terminal 32. The first terminals 30 are electrically connected to the photosensitive chip 26, and the second terminals 32 are electrically connected to the first electrodes 15 of the substrate 10. The transparent layer 34 is adhered to the upper surface 20 of the frame layer 18.

The image sensor package typically has to be tested to check whether the number of particles left in the image sensor package satisfies the quality standard. However, when the test result represents that the number of particles exceeds the quality standard, the transparent layer 34 cannot be removed and cleaned. Instead, the overall image sensor package has to be treated as waste material. Thus, the material is wasted and the manufacturing cost is high.

SUMMARY OF THE INVENTION

An object of the invention is to provide a method of disassembling an image sensor package to increase the product reliability.

Another object of the invention is to provide a simplified method of disassembling an image sensor package To achieve the above-mentioned objects, the invention provides a method of disassembling an image sensor package, which comprises a substrate and a glass layer at opposite sides. The method includes the steps of: providing a film tape adhered to the glass layer; providing a vacuuming means to suck the substrate of the image sensor package; and moving the vacuuming means away from the film tape to peel the glass layer off the image sensor package.

DETAILED DESCRIPTION OF THE INVENTION

Figure 1:
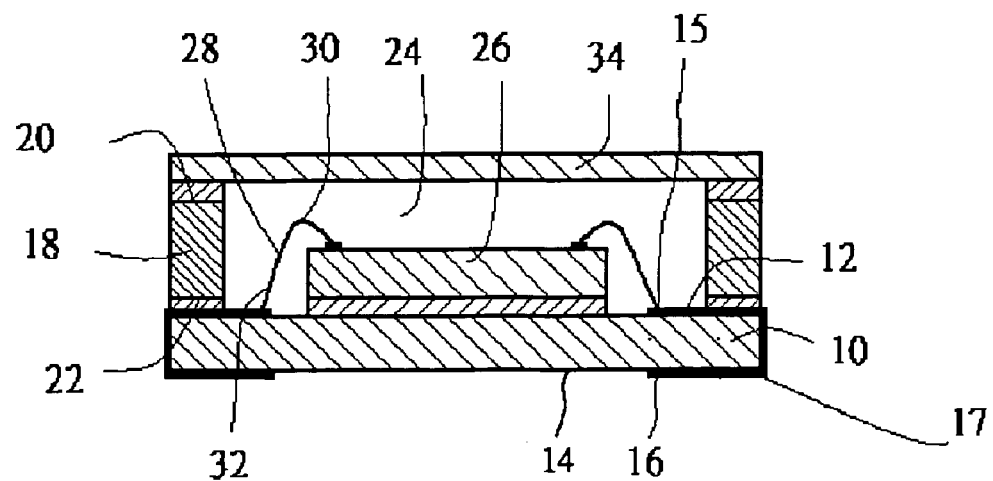
FIG. 1 is a schematic illustration showing a conventional image sensor structure.
Figure 2:
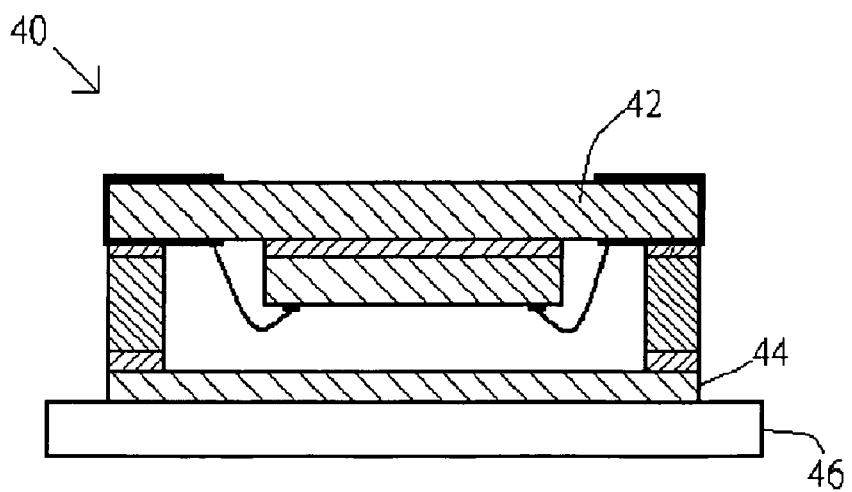
FIG. 2 is a first illustration showing a method of disassembling an image sensor package of the present invention.
Figure 3:
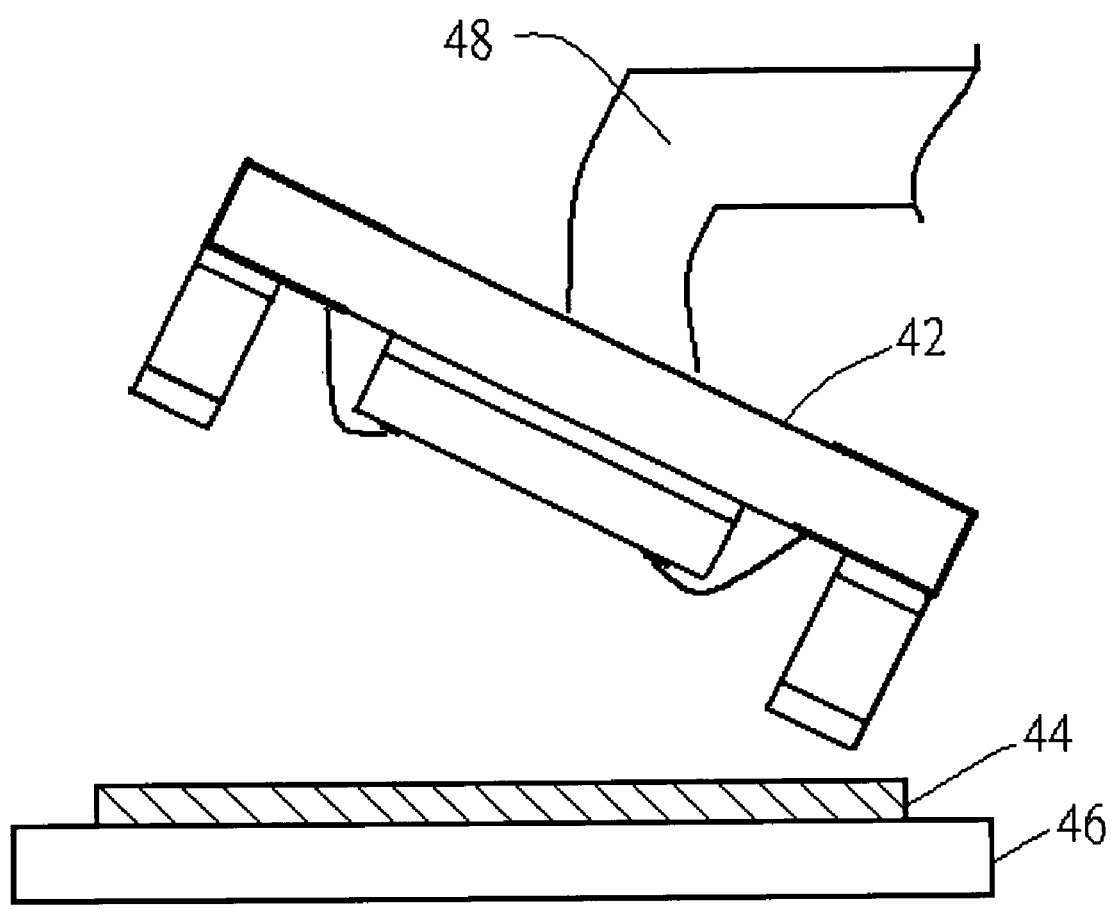
FIG. 3 is a second illustration showing a method of disassembling the image sensor package of the present invention.

Please refer to FIGS. 2 and 3, a method of disassembling an image sensor package of the present invention includes the following steps.

First, an image sensor package 40 including a substrate 42 and a glass layer 44 is provided.

Next, a film tape 46 adhered to the glass layer 44 of the image sensor package 40 is provided.

Then, a vacuuming device 48 is provided to suck the substrate 42 of the image sensor package 40.

Next, the vacuuming device 48 is moved away from the film tape 46 slantingly to peel the glass layer 44 off the image sensor package 40.

While the invention has been described by the way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. A method of disassembling an image sensor package, which comprises a substrate and a glass layer at opposite sides, the method comprising the steps of:
   adhering a film tape to the glass layer, wherein the film tape is separated from the substrate;
   providing a vacuuming means to suck the substrate of the image sensor package; and
   moving the vacuuming means away from the film tape to peel the glass layer off the image sensor package.

2. The method according to claim 1, wherein the vacuuming means is moved away from the film tape slantingly.

* * * * *